(12) United States Patent
Burbach et al.

(10) Patent No.: US 7,238,578 B2
(45) Date of Patent: Jul. 3, 2007

(54) METHOD OF FORMING A SEMICONDUCTOR STRUCTURE COMPRISING TRANSISTOR ELEMENTS WITH DIFFERENTLY STRESSED CHANNEL REGIONS

(75) Inventors: Gert Burbach, Dresden (DE); Rolf Stephan, Dresden (DE); Karsten Wieczorek, Dresden (DE); Manfred Horstmann, Duerrroehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 283 days.

(21) Appl. No.: 11/114,262

(22) Filed: Apr. 26, 2005

(65) Prior Publication Data

US 2006/0046400 A1  Mar. 2, 2006

(30) Foreign Application Priority Data

Aug. 31, 2004  (DE) .................. 10 2004 042 167

(51) Int. Cl.
*H01L 21/8234* (2006.01)
(52) U.S. Cl. .............. 438/275; 438/197; 438/283; 438/637; 257/E21.409
(58) Field of Classification Search ............ 438/282
See application file for complete search history.

(56) References Cited

U.S. PATENT DOCUMENTS

| 6,984,564 | B1* | 1/2006 | Huang et al. ........... 438/275 |
| 7,205,615 | B2* | 4/2007 | Tsutsui et al. ........... 257/369 |
| 2003/0181005 | A1* | 9/2003 | Hachimine et al. ....... 438/231 |
| 2004/0104405 | A1 | 6/2004 | Huang et al. ........... 257/199 |
| 2004/0142545 | A1 | 7/2004 | Ngo et al. ............. 438/585 |
| 2004/0159834 | A1 | 8/2004 | Huang et al. ........... 257/18 |

OTHER PUBLICATIONS

Shimizu et al., "Local Mechanical-Stress Control (LMC): A New Technique for CMOS-Performance Enhancement," 2001 IEEE, 19.4.1-19.4.4.

* cited by examiner

*Primary Examiner*—Michael Lebentritt
*Assistant Examiner*—Cheung Lee
(74) *Attorney, Agent, or Firm*—Williams, Morgan & Amerson, P.C.

(57) ABSTRACT

A semiconductor structure comprising a first transistor element and a second transistor element is provided. Stress in channel regions of the first and the second transistor element is controlled by forming stressed layers having a predetermined stress over the transistors. The stressed layers may be used as etch stop layers in the formation of contact vias through an interlayer dielectric formed over the transistors.

18 Claims, 7 Drawing Sheets

METHOD OF FORMING A SEMICONDUCTOR STRUCTURE COMPRISING TRANSISTOR ELEMENTS WITH DIFFERENTLY STRESSED CHANNEL REGIONS

BACKGROUND OF THE INVENTION

1. Field of the Invention

The present invention relates to the formation of integrated circuits, and, more particularly, to the formation of field effect transistors having a channel region with a specified intrinsic stress to improve the charge carrier mobility.

2. Description of the Related Art

Integrated circuits comprise a large number of individual circuit elements, such as transistors, capacitors and resistors and the like. These elements are connected internally to form complex circuits, such as memory devices, logic devices and microprocessors. The performance of integrated circuits can be improved by increasing the number of functional elements in the circuit in order to increase its functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They allow control of a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

The source region, the drain region and the gate electrode of a field effect transistor in an integrated circuit are connected to other circuit elements by means of contact vias which are formed in a layer of an interlayer dielectric over the transistor. Since the source and drain regions and the gate electrode have different heights, and a surface of the interlayer dielectric is substantially planar, the individual contact vias have different depths. In the formation of the contact vias, a mask is formed on the interlayer dielectric which exposes those portions of the interlayer dielectric where the contact vias are to be formed. Then, an anisotropic etching process is performed. In order to avoid an etchant used in the etching process affecting the transistor, an etch stop layer is provided between the transistor and the interlayer dielectric. The etchant is adapted to selectively remove the interlayer dielectric, leaving a material of the etch stop layer substantially intact. Thus, the etching stops as soon as the etch front reaches the etch stop layer, irrespective of the height of the feature below the contact via.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability. Furthermore, a reduction of the channel length may entail a need to reduce the depth of the source region and the drain region with respect to the interface formed by the gate insulation layer and the channel region which may, in some approaches, be achieved by forming raised source and drain regions formed with a specified offset to the gate electrode.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. A tensile stress in the channel region increases the mobility of electrons. Depending on the magnitude of the tensile stress, an increase of the electron mobility of up to 20% or more can be achieved. In an N-type transistor, this leads to a corresponding increase of the conductivity of the channel region. Conversely, compressive stress in the channel region may increase the mobility of holes, thereby providing the potential for enhancing the performance of P-type transistors.

In a method of forming field effect transistors having stressed channel regions according to the state of the art, a layer comprising an alloy of silicon and germanium or an alloy of silicon and carbon, respectively, is introduced into the channel region in order to create a tensile or compressive stress. Alternatively, such a stress-creating layer may be provided below the channel region.

A problem with the method of forming field effect transistors having stressed channel regions according to the state of the art is that the formation of the stress-creating layer requires a considerable modification of conventional and well-approved techniques used for the formation of field effect transistors. For instance, additional epitaxial growth techniques have to be developed and implemented into the process flow in order to form the stress-creating layers. Thus, the complexity of the formation of the transistors is significantly increased compared to the formation of transistors without stress-creating layers in or below the channel region.

In view of the above problem, a need exists for a method allowing the creation of desired stress conditions in a field effect transistor without requiring substantial modifications to the manufacturing process.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method of forming a semiconductor structure comprises providing a substrate. The substrate comprises a first transistor element and a second transistor element. A first stressed layer is formed above the first transistor element and the second transistor element. The first stressed layer has a first predetermined intrinsic stress. A first dielectric layer is formed above the first transistor element. The first dielectric layer does not cover the second transistor element. A second stressed layer is formed above the first dielectric layer and the second transistor element. The second stressed layer has a second predetermined intrinsic stress that is different than the first predetermined intrinsic stress. A second dielectric layer is formed above the substrate. The first dielectric layer and the second dielectric layer are planarized.

According to another illustrative embodiment of the present invention, a method of forming a semiconductor structure comprises providing a substrate. The substrate comprises a first transistor element having a first channel region and a second transistor element having a second channel region. A first stressed layer is formed above the first transistor element and the second transistor element. The first stressed layer has a first predetermined intrinsic stress. A second stressed layer is formed above the first transistor element and the second transistor element. The second stressed layer has a second predetermined intrinsic stress. A portion of the second stressed layer located above the first transistor element is selectively removed. The second channel region is substantially unstressed and the first channel region is stressed.

According to yet another illustrative embodiment of the present invention, a semiconductor structure comprises a substrate. The substrate comprises a first transistor element having a first channel region and a second transistor element having a second channel region. A first stressed layer is formed above the first transistor element and the second transistor element. The first stressed layer has a first predetermined intrinsic stress. A second stressed layer is formed above the second transistor element. The second stressed layer has a second predetermined intrinsic stress. The second stressed layer does not cover the first transistor element. The second channel region is substantially unstressed and the first channel region is stressed.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention allows the formation of a semiconductor structure comprising transistors, the channel regions of which are exposed to different mechanical stress. More particularly, the channel region of one transistor in the semiconductor structure can be exposed to a tensile stress, whereas the channel region of another transistor may be exposed to a compressive stress. In other embodiments, the channel region of the first transistor can be stressed, whereas the channel region of the second transistor is substantially unstressed.

The stress in the channel regions of the transistors can be created by forming stressed layers having a predetermined stress over the transistors. In some embodiments of the present invention, the stressed layers may be used as etch stop layers in the formation of contact vias through a layer of an interlayer dielectric formed over the transistors.

Figure 1:
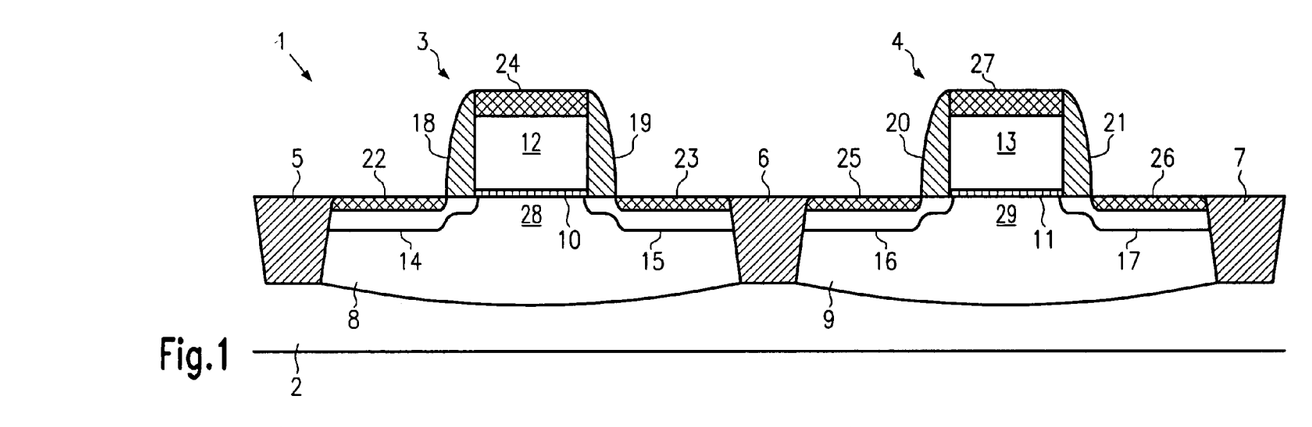
FIG. 1 shows a schematic cross-sectional view of a semiconductor structure.

With reference to the drawings, further illustrative embodiments of the present invention will now be described in more detail. FIG. 1 shows a schematic cross-sectional view of a semiconductor structure 1. The semiconductor structure 1 comprises a substrate 2. The substrate 2 comprises a first transistor element 3 and a second transistor element 4. Shallow trench isolations 5, 6, 7 electrically insulate the transistor elements 3, 4 from each other and from other circuit elements in the semiconductor structure 1.

The first transistor element 3 comprises an active region 8. In the active region 8, a source region 14 and a drain region 15 are formed adjacent a channel region 28. Over the channel region 28, a gate electrode 12, which is separated from the active region 8 by a gate insulation layer 10, is formed. Sidewall spacers 18, 19 are formed adjacent the gate electrode 12. The source region 14 comprises a metal silicide region 22. Similarly, the drain region 15 comprises a metal silicide region 23. A further metal silicide region 24 is formed in the gate electrode 24.

Similar to the first transistor element 3, the second transistor element 4 comprises an active region 9, a source region 16, a drain region 17, a channel region 29, a gate electrode 13, a gate insulation layer 11, sidewall spacers 20, 21 and metal silicide regions 25, 26, 27 formed in the source region 16, the drain region 17 and the gate electrode 13, respectively.

A method of forming the semiconductor structure 1 will be described with reference to FIG. 1. First, the trench isolations 5, 6, 7 and the active regions 8, 9 are formed in the substrate 2. Then, the gate insulation layers 10, 11 and the gate electrodes 12, 13 are formed over the substrate 2. This can be done by means of advanced techniques of ion implantation, oxidation, deposition and photolithography. Subsequently, dopant ions are implanted into the source regions 14, 16 and the drain regions 15, 17. Then, the sidewall spacers 18, 19, 20, 21 are formed adjacent the gate electrodes 12, 13, which may be done by means of conformally depositing a layer of a spacer material over the substrate 2 and performing an anisotropic etching process, as known to persons skilled in the art. The source regions 14, 16 and the drain regions 15, 17 are then completed by a further implantation of dopant ions. In this implantation, the sidewall spacers 18, 19, 20, 21 protect portions of the source regions 14, 16 and the drain regions 15, 17 adjacent the gate electrodes 12, 13 from being irradiated with ions. Thus, the source and drain regions comprise source extensions and drain extensions, respectively, which are shallower than the rest of the source and drain regions. Finally, the metal silicide regions 22, 23, 24, 25, 26, 27 are formed by depositing a metal layer over the substrate 2 and annealing the semiconductor structure 1 to initiate a chemical reaction between the metal and the silicon in the source regions 14, 16, the drain regions 15, 17 and the gate electrodes 12, 13.

In some embodiments of the present invention, one of the transistor elements 3, 4 is a P-type transistor, whereas the other of the transistor elements 3, 4 is an N-type transistor. In such embodiments, in each of the ion implantation processes performed in the formation of the source regions 14, 16 and the drain regions 15, 17, one of the transistor elements 3, 4 is covered by a first mask (not shown). Then, the semiconductor structure 1 is irradiated with ions of a first dopant, e.g., a P-type dopant such as boron. Subsequently, the first mask is removed and the other transistor element is covered by a second mask (not shown). Then, the semiconductor structure 1 is irradiated with ions of a second dopant, e.g., an N-type dopant such as arsenic.

Further stages of a method of forming a semiconductor structure according to the present invention are shown in FIGS. 2a-2e. First, a semiconductor structure 1 as described above with reference to FIG. 1 is provided. A first stressed layer 201 is formed over the first transistor element 3 and the second transistor element 4. The first stressed layer 201 has a first predetermined intrinsic stress.

Figure 2A:
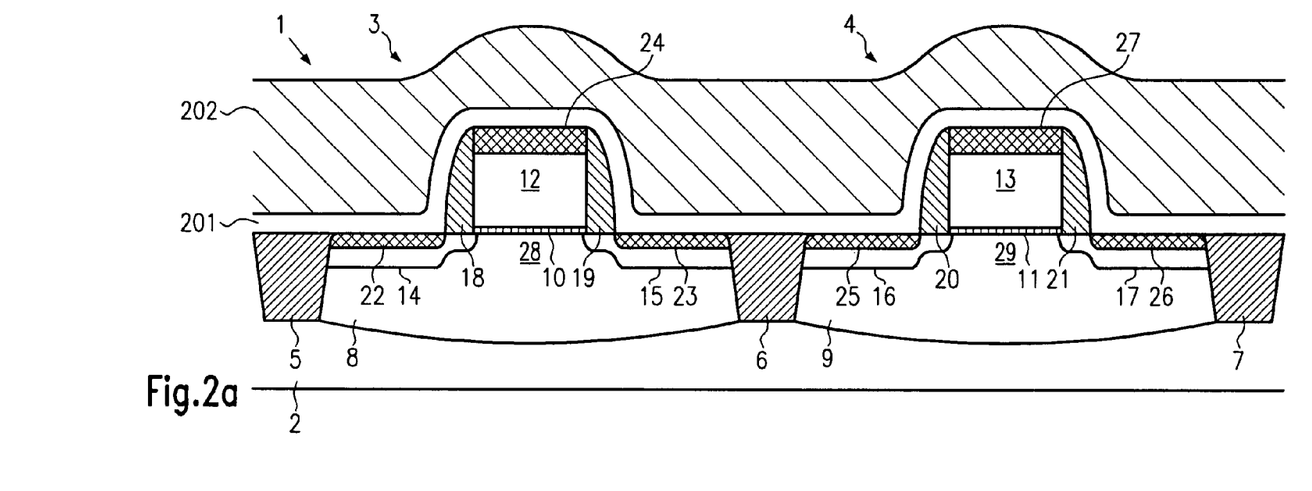
FIGS. 2a-2e show schematic cross-sectional views of a semiconductor structure in stages of a manufacturing process according to an embodiment of the present invention.

The first stressed layer 201 can be formed by a variety of techniques, for example, by means of plasma enhanced chemical vapor deposition. Plasma enhanced chemical vapor deposition is a method of depositing a material on a deposition surface. In the formation of the layer 201, the deposition surface may comprise surfaces of the source regions 14, 16, the drain regions 15, 17, the gate electrodes 12, 13, the sidewall spacers 18, 19, 20, 21 and the shallow trench isolations 5, 6, 7. The deposited material is formed as a result of a chemical reaction between gaseous reactants, which occurs on or in the vicinity of the deposition surface. Solid products of the reaction are deposited on the deposition surface. The chemical reaction occurs in a plasma, which may be created, for example, by means of a glow discharge. The glow discharge can be generated by applying a radio frequency alternating voltage between two electrodes, one of which is provided close to the semiconductor structure 1. In addition to the radio frequency alternating voltage, a direct voltage or a low frequency alternating voltage, which is denoted as "bias voltage," may be applied between the electrodes. In the glow discharge, molecules of the gaseous reactant are decomposed into a variety of species including radicals, ions, atoms and molecules in excited states. These species impinge on the deposition surface and are chemically bond to the deposition surface. Thus, a layer of material is deposited on the deposition surface.

The first predetermined intrinsic stress can be determined by the deposition conditions applied in the formation of the first stressed layer 201. In general, the first predetermined stress depends on the gas mixture, the deposition rate, the temperature, the radio frequency alternating voltage and the bias voltage. The amount of tensile or compressive stress in the layer 201 can be adjusted, for instance, by varying one or more of these parameters. In particular, the bias voltage may be varied to adjust an ion bombardment during the deposition process, thereby creating tensile or compressive stress in the first stressed layer 201. In one illustrative embodiment, the layer 201 may have an intrinsic stress having an absolute value ranging from approximately 300-800 MPa, and it may have a thickness ranging from approximately 40-100 nm or more.

The first stressed layer 201 may comprise a dielectric material, e.g., silicon nitride. A tensile stress in the first stressed layer 201 when comprising silicon nitride may be created by significantly reducing or turning off the bias voltage. On the other hand, a moderately high bias voltage creates compressive stress in the first stressed layer 201.

After the formation of the first stressed layer 201, a first dielectric layer 202 is deposited over the semiconductor structure 1. A thickness of the first dielectric layer 202 can be greater than a height of the gate electrodes 12, 13 covered with the first stressed layer 201. Due to the topology of the underlying semiconductor structure 1, a surface of the first dielectric layer 202 is uneven. In particular, the first dielectric layer 202 comprises bumps over the gate electrodes 12, 13.

The first dielectric layer 202 can be deposited by means of chemical vapor deposition, plasma enhanced chemical vapor deposition or any other deposition process known to persons skilled in the art. The first dielectric layer 202 may comprise silicon dioxide.

Figure 2B:
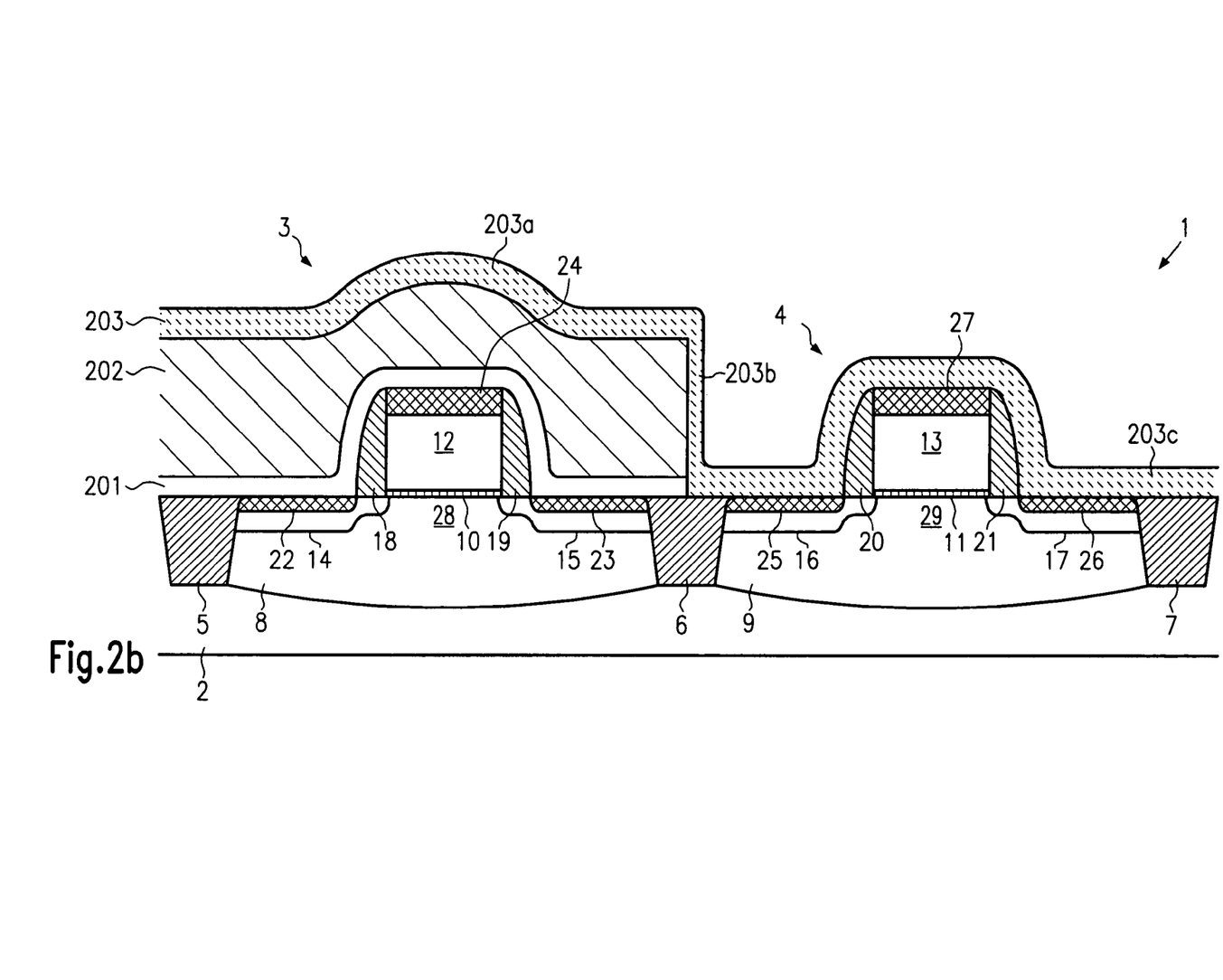

FIG. 2b show a schematic cross-sectional view of the semiconductor structure 1 in a later stage of the manufacturing process. The first dielectric layer 202 is patterned by removing a portion of the first dielectric layer 202 located over the second transistor element 4. This may be done by means of techniques of photolithography and etching techniques known to persons skilled in the art. After the patterning, the first dielectric layer 202 does not cover the second transistor element 4.

A portion of the first stressed layer 201 located over the second transistor element 4 may be removed after the patterning of the first dielectric layer 202. This can be done by means of an etching process. In one embodiment, the first dielectric layer 202 functions as a mask, protecting a portion of the first stressed layer 201 located over the first transistor element 3 from being exposed to an etchant.

The etching process may comprise exposing the semiconductor structure 1 to an etchant adapted to selectively remove the material of the first stressed layer 201, leaving the material of the first dielectric layer 202 and the materials of the shallow trench isolations 6, 7, the sidewall spacers 18, 19 and the metal silicide regions 24, 27 substantially intact.

In other embodiments of the present invention, the first stressed layer 201 may comprise a thin liner layer (not shown) which is formed between the layer 201 and the first transistor element 3 and the second transistor element 4. The liner layer may act as an etch stop layer, protecting the first transistor element 3 and the second transistor element 4 from being affected by the etchant and/or may provide an indication when the portion of the first stressed layer over the second transistor element is removed.

In further embodiments of the present invention, the first stressed layer 201 is left on both of the first transistor element 3 and the second transistor element 4.

A second stressed layer 203 is formed over the first dielectric layer 202 and the second transistor element 4. The second stressed layer 203 has a second predetermined stress. Portions 203a, 203c of the second stressed layer are located over the first dielectric layer 202 and the second transistor element 4, respectively. A further portion 203b of the second stressed layer 203 is located over an edge of the first dielectric layer 202. The edge of the first dielectric layer 202 is formed in the patterning of the first dielectric layer 202 which is performed to uncover the second transistor element 4. The second stressed layer may comprise a dielectric material, e.g., silicon nitride.

The formation of the second stressed layer 203 can comprise a non-conformal deposition process adapted to deposit a stressed layer of a material over the first dielectric layer 202 and the second transistor element 4. In non-conformal deposition, a thickness of the deposited layer of material, measured in a direction perpendicular to the underlying portion of the deposition surface, depends on the slope of the underlying portion of the deposition surface. In particular, a thickness of weakly inclined portions of the second stressed layer 203, such as portions 203a, 203c, is greater than a thickness of portion 203b formed over the steep edge of the first dielectric layer 202.

Non-conformal deposition may be performed by applying a moderately high bias voltage in plasma enhanced chemical vapor deposition, the electrode close to the semiconductor structure 1 being negatively charged. Thus, ions in the plasma are accelerated in a direction perpendicular to the surface of the substrate 2. The motion of the ions in the direction perpendicular to the substrate 2 entails a material transport in this direction. The transported material is preferentially deposited on weakly inclined portions of the semiconductor structure 1. Therefore, the second stressed layer 203 has a greater thickness on the weakly inclined portions than on steep portions of the semiconductor structure 1. In one illustrative embodiment of the present invention, portions of the second stressed layer 203 over weakly inclined portions of the semiconductor structure may have a thickness in a range from approximately 40-100 nm or more. Portions of the second stressed layer 203 over steep portions of the semiconductor structure 203 may have a thickness in a range from approximately 20-80 nm or more.

The second predetermined stress can be compressive or tensile. In embodiments of the present invention wherein the first predetermined stress is tensile, the second predetermined stress can be compressive. Creating a tensile stress in the first stressed layer and a compressive stress in the second stressed layer is particularly advantageous if the material of the second stressed layer is deposited non-conformally, since the moderately high bias voltage used in the non-conformal deposition may favor the creation of a compressive intrinsic stress. In particular, this is the case if the second stressed layer comprises silicon nitride. An absolute value of the second predetermined stress may be in a range from about 300-800 MPa.

Figure 2C:
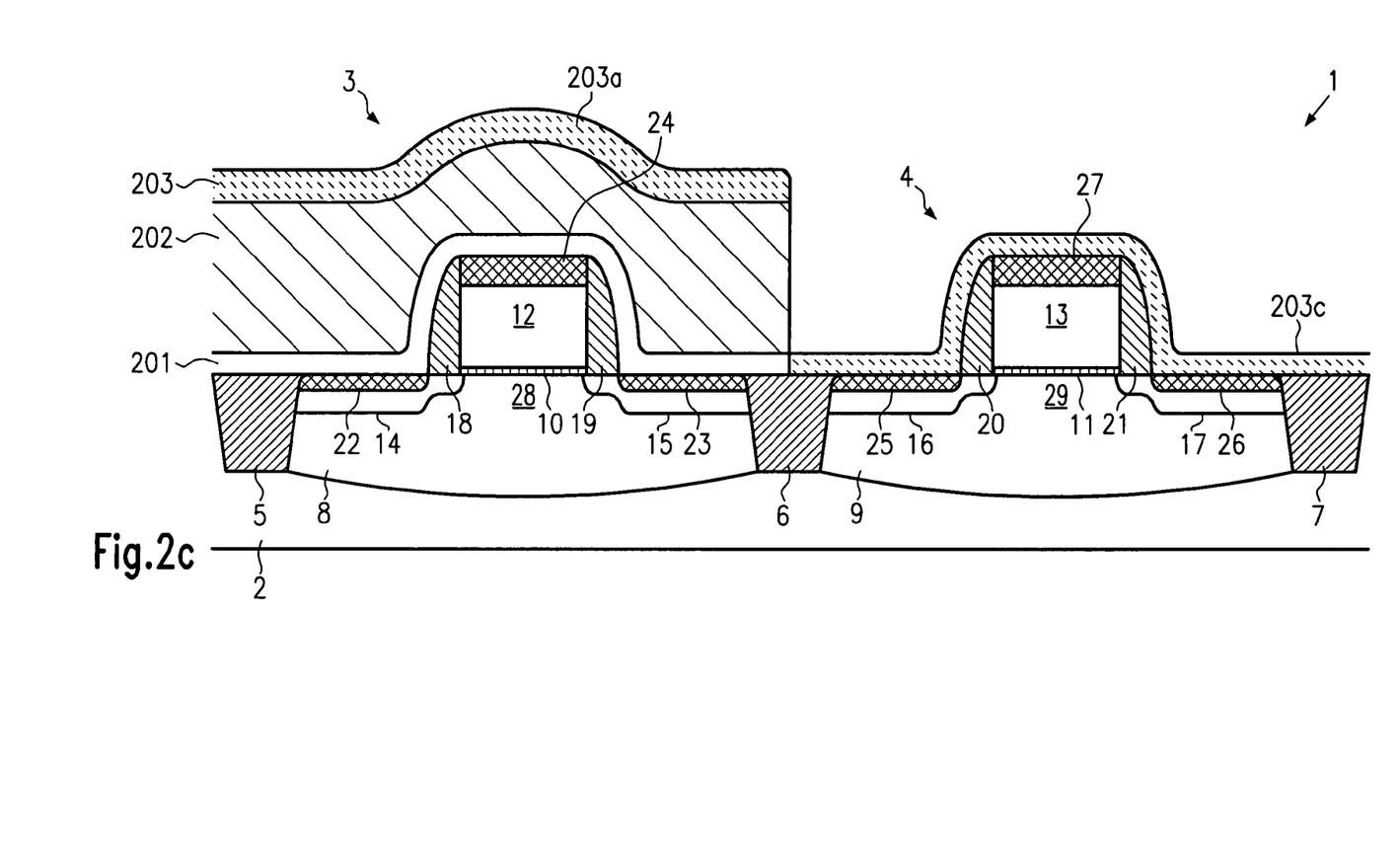

A further stage of the manufacturing process is shown in FIG. 2c. An isotropic etching process being adapted to substantially remove the portion 203b of the second stressed layer located over the edge of the first dielectric layer 202 can be performed.

In isotropic etching, a rate at which material is removed is substantially independent of the slope of the etched surface. Portions 203a and 203c of the second stressed layer 203 are etched at substantially the same rate as the portion 203b located over the edge of the first dielectric layer 202. Since the portion 203b of the second stressed layer is thinner than the portions 203a, 203c, it is thus removed more quickly than the portions 203a, 203c. The etching process is stopped as soon as the portion 203b is substantially removed. Hence, parts of portions 203a and 203c remain on the semiconductor structure 1. The material loss in portions 203a, 203c may be taken into account in advance by correspondingly increasing the deposited thickness of the second stressed layer 203. In one illustrative embodiment of the present invention, the etch process may be adapted to remove a portion of the second stressed layer having a thickness in a range from about 20-50 nm or more.

In some embodiments of the present invention, the isotropic etching may remove portions of the second stressed layer 203 located over the sidewall spacers 20, 21 which have a greater slope than, e.g., portions located over the source region 16 and the drain region 17 of the second transistor element 4.

In other embodiments of the present invention, no etching process is performed, and the portion 203b of the second stressed layer 203 is left on the semiconductor structure 1. In such embodiments, the deposition of the second stressed layer 203 need not be non-conformal. Instead, the second stressed layer 203 can be deposited conformally.

Figure 2D:
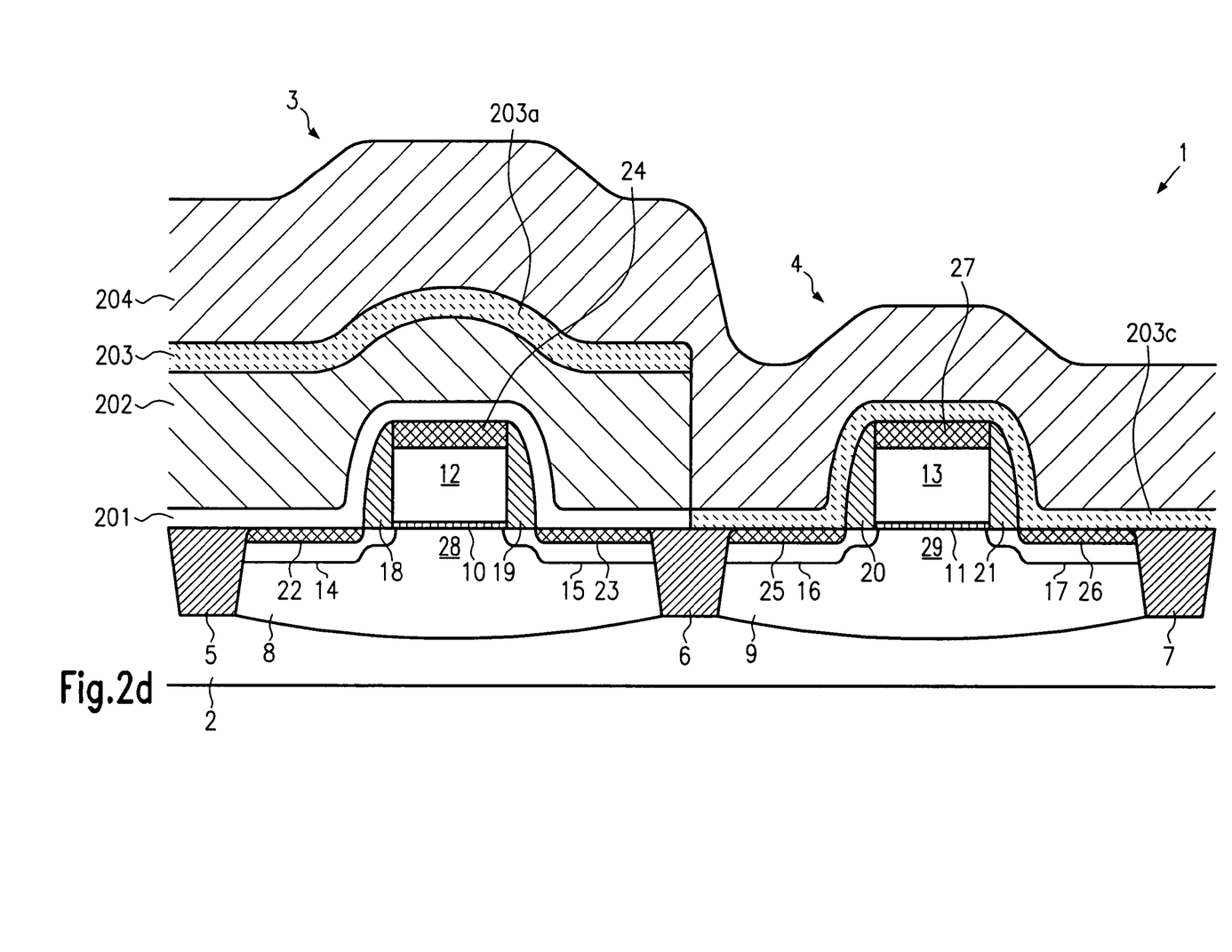

FIG. 2d shows a schematic cross-sectional view of the semiconductor structure 1 in a further stage of the manufacturing process. A second dielectric layer 204 is formed over the substrate 1. Similar to the first dielectric layer 202, the second dielectric layer 204 may be formed by chemical vapor deposition, plasma enhanced chemical vapor deposition, or any other deposition process known to persons skilled in the art. A thickness of the second dielectric layer 204 is greater than a height of the gate electrodes 12, 13 of the first transistor element 12 and the second transistor element 13.

The second dielectric layer 204 can be formed from the same material as the first dielectric layer 202. In particular, both the first dielectric layer 202 and the second dielectric layer 204 can comprise silicon dioxide. In other embodiments of the present invention, however, the first dielectric layer 202 and the second dielectric layers may comprise different materials.

The second dielectric layer 204 covers the portion 203a of the second stressed layer 203, and the second transistor element 4, which is covered by the portion 203c of the second stressed layer 203. In embodiments of the present invention where the portion 203b of the second stressed layer covering the edge of the first dielectric layer 202 is removed, the second dielectric layer 204 adjoins to the first dielectric layer 202. Due to the topography of the first dielectric layer 202 and the second transistor element 4, a surface of the second dielectric layer is uneven. In particular, the surface of the second dielectric layer 204 comprises a bump over the gate electrode 13 of the second transistor element 4, and an elevation over the first transistor element 3, where the first dielectric layer 202 and the portion 203a of the first dielectric layer 203 are located under the second dielectric layer 204.

Figure 2E:
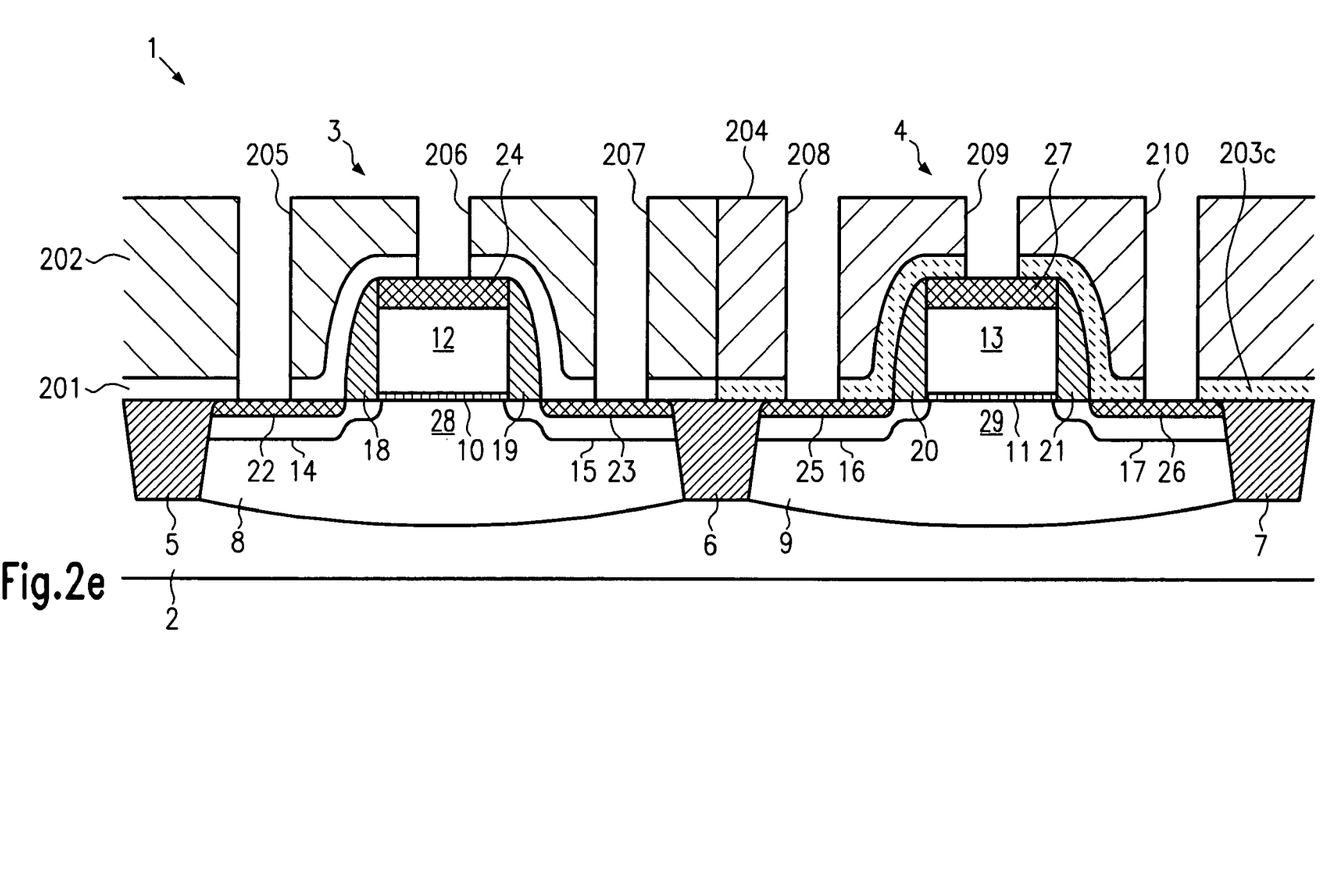

A schematic cross-sectional view of the semiconductor structure 1 in yet another stage of the manufacturing process is shown in FIG. 2e. The first dielectric layer 202 and the second dielectric layer 204 are planarized. This can be done by means of chemical mechanical polishing. In chemical mechanical polishing, the semiconductor structure 1 is moved relative to a polishing pad. Slurry is supplied to an interface between the semiconductor structure 1 and the polishing pad. The slurry comprises a chemical compound reacting with the material or materials on the surface of the semiconductor structure 1. The reaction product is removed by abrasives contained in the slurry and/or the polishing pad.

In the planarization, a portion of the second dielectric layer 204 located over the first dielectric layer 202, the portion 203a of the second stressed layer 203 and the bump of the first dielectric layer 202 over the gate electrode 12 of the first transistor element 3 are removed. After the planarization, the first dielectric layer 202 and the second dielectric layer 204 have a common, planar surface.

In embodiments of the present invention wherein the first dielectric layer 202 and the second dielectric layer 204 are formed from the same material, and the portion 203b of the second stressed layer 203 is removed, the semiconductor structure is covered by a continuous dielectric layer having a planar surface, similar to interlayer dielectrics known to persons skilled in the art. Thus, advantageously known methods may be applied for the further processing of the semiconductor structure 1 substantially without any modification.

After the planarization, contact vias 205, 206, 207 are formed in the first dielectric layer 202. In the second dielectric layer 204, contact vias 208, 209, 210 are formed. As is well known to persons skilled in the art, this can be done by photolithographically forming a mask over the first dielectric layer 202 and the second dielectric layer which exposes portions of the dielectric layers 202, 204 wherein the contact vias 205-210 are to be formed. Subsequently, an anisotropic etching process is performed which is adapted to selectively remove the material of the first dielectric layer 202 and the material of the second dielectric layer 204 while an etch rate of the first stressed layer 201 and the second stressed layer 203 is significantly lower. Thus, the removal of material is reliably stopped within the first stressed layer 201 or the second stressed layer 203. Hence, the stressed layers 201, 203 function as etch stop layers.

Subsequently, an etching process adapted to remove the first stressed layer 201 and/or the second stressed layer is performed. The etching process can comprise exposing the semiconductor structure 1 to an etchant adapted to selectively remove the material of the first stressed layer 201 and the second stressed layer 203, leaving the silicide in the metal silicide regions 22, 23, 24, 25, 26, 27 and the material of the first dielectric layer 202 and the second dielectric layer 204 substantially intact.

In other embodiments of the present invention, the first stressed layer 201 and/or the second stressed layer 203 may comprise a thin liner layer (not shown) at the underside thereof which separates the stressed layers from the first transistor element 3 and the second transistor element 4. The liner layer may act as an etch stop layer, protecting the transistor elements 3, 4 from being affected in the etching process, and/or may provide an indication when the first stressed layer 201 and/or the second stressed layer 203 are removed from the bottom of the contact vias 205-210.

Finally, the contact vias 205-210 can be filled with an electrically conductive material which may include a metal such as, e.g., tungsten. When filled with the electrically conductive material, the contact via 205 provides electrical contact to the source region 14, the contact via 206 provides electrical contact to the gate electrode 12 and the contact via 207 provides electrical contact to the drain region 15. Similarly, the contact via 208 provides electrical contact to the source region 16, the contact via 209 provides electrical contact to the gate electrode 13 and the contact via 210 provides electrical contact to the drain region 17.

In embodiments of the present invention wherein a portion of the first stressed layer 201 located over the second transistor element 4 is removed after the formation of the first dielectric layer, after the completion of the method described above, the first transistor element 3 is covered by the first stressed layer 201 and the second transistor element 4 is covered by the second stressed layer 203. In other embodiments, wherein the first stressed layer 201 is left on the second transistor element 4, the first transistor element 3 is covered by the first stressed layer, whereas the second transistor element 4 is covered both by the first stressed layer 201 and the second stressed layer 203.

Due to the intrinsic stress in the first stressed layer 201 and the second stressed layer 203, these layers exert elastic forces to the transistor elements 3, 4. Since the first stressed layer 201 and the second stressed layer 203 cover large areas of the first transistor element 3 and the second transistor element 4, these elastic forces may modify the stress in the transistor elements 3, 4, and, in particular, the stress in the channel regions 28, 29. The stress in the channel region 28 of the first transistor element 3 is influenced by the first predetermined intrinsic stress of the first stressed layer 201.

In embodiments of the present invention wherein the first stressed layer 201 is removed from the second transistor element 4, the stress in the channel region 29 of the second transistor element 4 is influenced by the second predetermined intrinsic stress of the second stressed layer 203. Hence, if the first predetermined intrinsic stress is tensile and the second predetermined intrinsic stress is compressive, the channel region 28 is subjected to a tensile stress and the channel region 29 is subjected to a compressive stress. A tensile first predetermined intrinsic stress improves the mobility of electrons in the channel region 28, which is particularly advantageous if the first transistor element 3 is an N-type transistor. A compressive second predetermined intrinsic stress improves the mobility of holes in the channel region 29, which is particularly advantageous if the second transistor element is a P-type transistor. Conversely, a compressive first predetermined intrinsic stress and a tensile second predetermined intrinsic stress are advantageous if the first transistor element 3 is a P-type transistor and the second transistor element 4 is an N-type transistor.

In other embodiments, wherein the second transistor element 4 is covered both by the first stressed layer 201 and the second stressed layer 203, both the first predetermined intrinsic stress and the second predetermined intrinsic stress influence the stress in the channel region 29. If one of the first and the second predetermined intrinsic stresses is tensile and the other is compressive, the influence of the second predetermined intrinsic stress may totally or partially compensate the influence of the first predetermined stress, such that the channel region 29 is subjected to a considerably lower stress than the channel region 28. In some embodiments of the present invention, the channel region 28 is stressed, whereas the channel region 29 is substantially unstressed.

The first predetermined intrinsic stress and the second predetermined intrinsic stress may be controlled to adjust the stress in each of the channel regions 28, 29. To this end, known methods for measuring the stress in the channel region of a field effect transistor, such as X-ray diffraction, may be used. A plurality of semiconductor structures similar to the semiconductor structure 1 are formed. In the formation of each of these semiconductor structures, different parameters are used in the deposition of the first stressed layer 201 and/or the second stressed layer 203 to obtain different values of the first predetermined intrinsic stress and the second predetermined intrinsic stress. Then, the stress in the channel regions of field effect transistors in each of the semiconductor structures is measured to relate the first and the second predetermined intrinsic stress to the stress in the channel regions. Based on the relation between the intrinsic stress in the layers 201, 203 and the stress in the channel regions, values of the first predetermined intrinsic stress and the second predetermined intrinsic stress may be determined which yield a respective desired stress in each of the channel regions 28, 29.

In other embodiments of the present invention, the first and the second predetermined intrinsic stress may be controlled to adjust a respective charge carrier mobility in each of the channel regions 28, 29. To this end, a plurality of semiconductor structures similar to the semiconductor structure 1 can be formed, each having a different first predetermined stress and/or a different second predetermined intrinsic stress than the other semiconductor structures. Then, the charge carrier mobility in the channel regions of the transistor elements in each of the semiconductor structures is measured using methods known to persons skilled in the art, and a relation between the first and the second predetermined stress and the charge carrier mobility is determined. Values of the first predetermined intrinsic stress and the second predetermined intrinsic stress yielding a desired charge carrier mobility can be obtained from this relation.

In the present invention, stress is created in the channel regions of field effect transistors by means of the first stressed layer 201 and the second stressed layer 203, which may be used as etch stop layers in the formation of contact vias and, thus, may replace etch stop layers used in conventional methods of forming a field effect transistor. Advantageously, providing the first stressed layer 201 and the second stressed layer 203 does not require substantial modifications of the formation of the first transistor element 3 and the second transistor element 4 compared to methods known in the art.

Figure 3A:
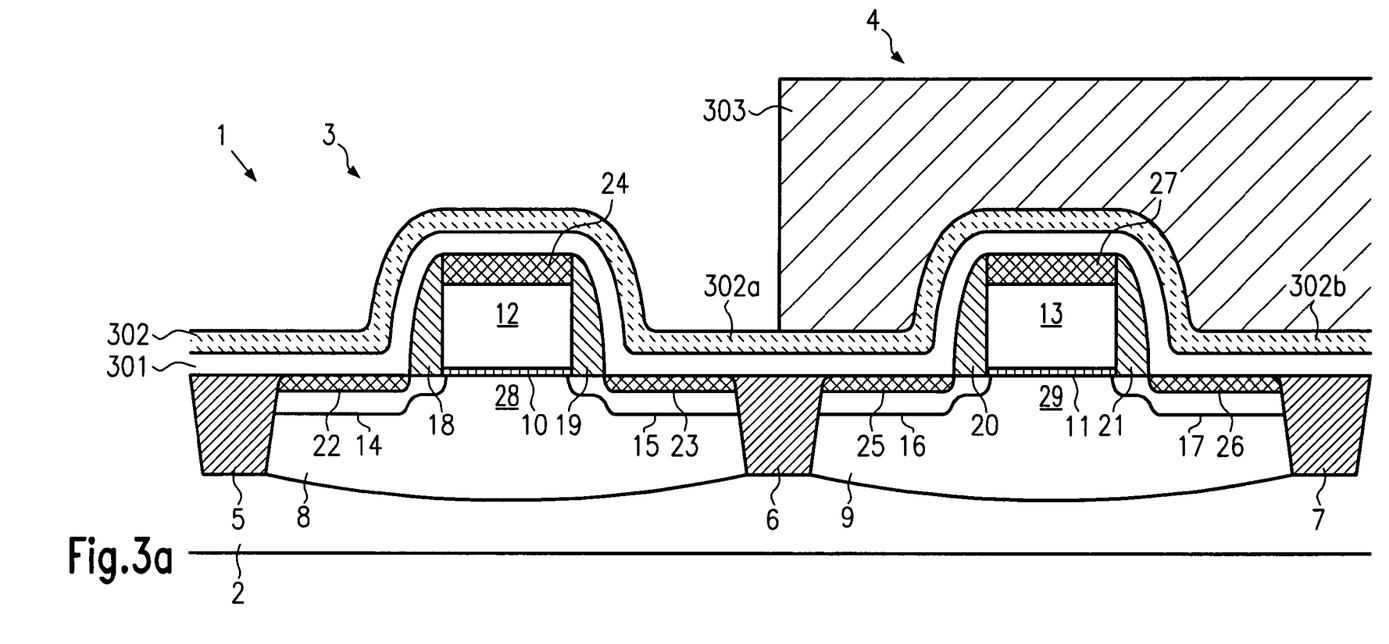
FIGS. 3a-3b show schematic cross-sectional views of a semiconductor structure in stages of a manufacturing process according to another embodiment of the present invention.
Figure 3B:
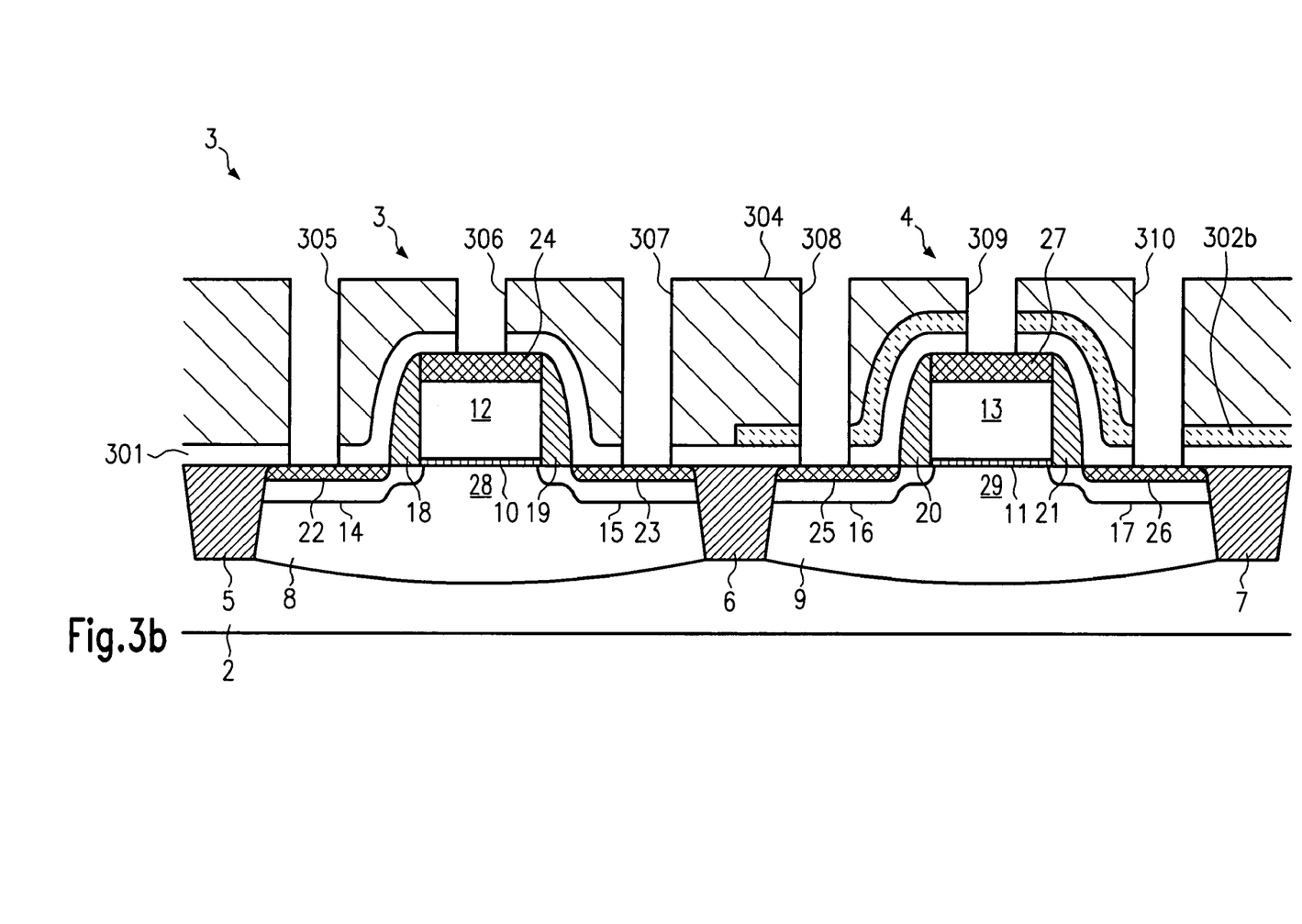

A method of forming a semiconductor structure according to a further embodiment of the present invention will be described with reference to FIGS. 3a and 3b. A semiconductor structure 1 as described above with reference to FIG. 1 is provided. Over the semiconductor structure 1, a first stressed layer 301 having a first predetermined intrinsic stress is formed. A second stressed layer 302 having a second predetermined intrinsic stress is deposited over the first stressed layer 301. The second stressed layer 302 comprises a portion 302a over the first transistor element 3 and a portion 302b over the second transistor element 4.

Similar to the first stressed layer 201 and the second stressed layer 203 in the embodiment of the present invention described above with reference to FIGS. 2a-2e, the stressed layers 301, 302 can be deposited by a variety of techniques, e.g., by means of plasma enhanced chemical vapor deposition. The first predetermined intrinsic stress and the second predetermined intrinsic stress may be controlled by varying one or more parameters comprising at least one of the composition of the reactant gas, the deposition rate, the temperature, the radio frequency alternating voltage or the bias voltage.

The first transistor element 3 can be an N-type transistor. The second transistor element 4 can be a P-type transistor. The first predetermined intrinsic stress can be tensile, and the second predetermined intrinsic stress can be compressive.

A mask 303 is formed over the second transistor element 3. The mask 303 can comprise a photoresist. As is well known to persons skilled in the art, a mask comprising a photoresist can be formed by applying the photoresist to the semiconductor structure 1, exposing the photoresist through a reticle and solving either the portions irradiated in the exposure or the non-irradiated portions in a developer.

In other embodiments, the mask 303 can comprise a hard mask similar to the first dielectric layer 202 in the embodiment described with reference to FIGS. 2a-2e. The hard mask may be formed by depositing a layer of a dielectric material, e.g., silicon dioxide, and patterning the layer of dielectric material by means of known techniques of etching and photolithography, similar to the formation of the first dielectric layer 202. The surface of the mask 303 need not be substantially flat, as shown in FIG. 3a, but may be uneven. In particular, the mask 303 may comprise a bump over the first transistor element 3.

Subsequently, the portion 302a of the second stressed layer 302 is removed by means of an etching process. This can be done by exposing the semiconductor structure 1 to an etchant adapted to selectively remove a material of the second stressed layer 302, leaving materials of the mask 303 and the first stressed layer 301 substantially intact. In other embodiments of the present invention, the second stressed layer 302 may comprise a thin liner layer (not shown), which is formed on the underside thereof on the first stressed layer 301. The liner layer may function as etch stop layer, protecting the first stressed layer 301 from an etchant used in the etching process, and/or may provide an indication when the portion 302a of the second stressed layer 302 is removed.

The mask 303 can be removed after the removal of the portion 302a of the second stressed layer 302. In embodiments of the present invention wherein the mask 303 is a hard mask, the mask 303 may remain on the semiconductor structure 1.

A dielectric layer 304 is deposited over the substrate 2. The dielectric layer 304 can be deposited by means of known methods such as chemical vapor deposition or plasma enhanced chemical vapor deposition. The dielectric layer 304 may comprise silicon dioxide.

In embodiments of the present invention wherein the mask 303 is left on the semiconductor structure 303, the dielectric layer 304 may be formed from substantially the same material as the mask 303. Thus, the mask 303 is incorporated into the dielectric layer 304 and becomes an integral part thereof. Correspondingly, a thickness of the dielectric layer 304 over the second transistor element 4 can be greater than a thickness of the dielectric layer 304 over the first transistor element 3. Hence, a surface of the dielectric layer 304 is uneven.

An unevenness of the surface of the dielectric layer 304 may also result from the presence of the gate electrodes 12, 13 on the surface of the substrate 2. A thickness of a portion of the dielectric layer 304 deposited on the gate electrodes 12, 13 can be substantially equal to a thickness of a portion of the dielectric layer 304 deposited, for example, on the source regions 14, 16 and the drain regions 15, 17. Therefore, the dielectric layer 304 may comprise bumps over the gate electrodes 12, 13. The dielectric layer 304 is planarized to obtain a planar surface of the dielectric layer 304. This may be done by means of chemical mechanical polishing.

Contact vias 305, 306, 307, 308, 309, 310 are formed through the dielectric layer 304, the first stressed layer 301 and/or the second stressed layer 302. The formation of the contact vias may be performed by means of etching techniques similar to those used in the formation of the contact vias 205-210 in the embodiment of the present invention described above with reference to FIGS. 2a-2e, the first stressed layer 301 and the second stressed layer 302 being used as etch stop layers. Subsequently, the contact vias 305-310 are filled with an electrically conductive material, e.g., a metal (not shown). When filled with the electrically conductive material, the contact vias 305, 306 and 307 provide electrical contact to the source region 14, the gate electrode 12 and the drain region 15 of the first transistor element 3. Similarly, the contact vias 308, 309 and 310 provide electrical contact to the source region 16, the gate electrode 13 and the drain region 17 of the second transistor element 4.

After the completion of the method described above, the first transistor element 3 is covered with the first stressed layer 301. The second transistor element 4 is covered by the first stressed layer 301 and the second stressed layer 302. The first predetermined intrinsic stress in the first stressed layer 301 and the second predetermined intrinsic stress in the second stressed layer 302 create elastic forces acting on the transistor elements 3, 4, in particular on the channel regions 28, 29. The stress in the channel region 28 of the first transistor element 3 is influenced by the first predetermined intrinsic stress. The stress in the channel region 29 of the second transistor element 4 is influenced both by the first predetermined intrinsic stress and the second predetermined intrinsic stress.

Similar to the embodiment described above with reference to FIGS. 2a-2e, the first predetermined stress and the second predetermined stress may be controlled to obtain a desired stress in each of the channel regions 28, 29, or to obtain a desired charge carrier mobility in each of the channel regions 28, 29.

The first predetermined intrinsic stress may be tensile and the second predetermined stress can be compressive. The predetermined intrinsic stresses can be adapted such that the channel region 28 is subjected to a tensile stress, whereas the channel region 29 is substantially unstressed. Thus, the mobility of holes in the channel region 29 is improved compared to that in a transistor element having a substantially unstressed channel region. This is particularly advantageous in embodiments of the present invention wherein the first transistor element 3 is an N-type transistor.

In other embodiments of the present invention, the first predetermined stress and the second predetermined stress can be adapted such that the channel region 28 is subjected to a compressive stress, whereas the channel region 29 is substantially unstressed.

The first transistor element 3 and the second transistor element 4 need not be located close to each other, as shown in FIGS. 1, 2a-2e and 3a-3b. In other embodiments of the present invention, the transistor elements 3, 4 may be provided in different regions of the substrate 2. In some embodiments of the present invention, the substrate 2 comprises a semiconductor wafer having a plurality of dies. In such embodiments, the first transistor element 3 and the second transistor element 4 can be provided on the same die, or may be provided on different dies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:

providing a substrate comprising a first transistor element and a second transistor element;

forming a first stressed layer above said first transistor element and said second transistor element, said first stressed layer having a first predetermined intrinsic stress;

forming a first dielectric layer above said first transistor element, wherein said first dielectric layer does not cover said second transistor element;

forming a second stressed layer above said first dielectric layer and said second transistor element, said second stressed layer having a second predetermined intrinsic stress that is different than said first predetermined intrinsic stress;

forming a second dielectric layer above said substrate; and planarizing said first dielectric layer and said second dielectric layer.

2. The method of claim 1, further comprising removing a portion of said first stressed layer located above said second transistor element, said removal of said portion of said first stressed layer being performed after said formation of said first dielectric layer.

3. The method of claim 1, wherein one of said first predetermined stress and said second predetermined stress is compressive and the other of said first predetermined stress and said second predetermined stress is tensile.

4. The method of claim 1, wherein one of said first transistor element and said second transistor element is a P-type transistor and the other of said first transistor element and said second transistor element is an N-type transistor.

5. The method of claim 1, wherein at least one of the formation of said first dielectric layer and the formation of said second dielectric layer comprises at least one of chemical vapor deposition and plasma enhanced chemical vapor deposition.

6. The method of claim 1, wherein said planarization of said first dielectric layer and said second dielectric layer comprises chemical mechanical polishing.

7. The method of claim 1, further comprising forming at least one contact via in said first dielectric layer and forming at least one contact via in said second dielectric layer.

8. The method of claim 1, wherein said formation of said second stressed layer comprises performing a non-conformal deposition process adapted to deposit a stressed layer of a material above said first dielectric layer and said second transistor element.

9. The method of claim 8, wherein said formation of said second stressed layer further comprises performing an isotropic etching process to substantially remove a portion of said layer of material located on an edge of said first dielectric layer.

10. The method of claim 1, wherein said planarization of said first dielectric layer and said second dielectric layer is adapted to remove a portion of said second stressed layer located above said first dielectric layer.

11. The method of claim 1, wherein said first transistor element comprises a first channel region and said second transistor element comprises a second channel region, one of said first channel region and said second channel region being stressed, the other of said first channel region and said second channel region being substantially unstressed.

12. The method of claim 1, wherein at least one of said first stressed layer and said second stressed layer comprises a dielectric material.

13. A method of forming a semiconductor structure, comprising:
providing a substrate comprising a first transistor element and a second transistor element;
forming a first stressed layer above said first transistor element and said second transistor element, said first stressed layer having a first predetermined intrinsic stress;
forming a first dielectric layer above said first transistor element, wherein said first dielectric layer does not cover said second transistor element;
after forming said first dielectric layer, removing a portion of said first stressed layer located above said second transistor element;
forming a second stressed layer above said first dielectric layer and said second transistor element, said second stressed layer having a second predetermined intrinsic stress that is different than said first predetermined intrinsic stress;
forming a second dielectric layer above said substrate;
planarizing said first dielectric layer and said second dielectric layer; and
forming at least one contact via in said first dielectric layer and forming at least one contact via in said second dielectric layer.

14. The method of claim 13, wherein one of said first predetermined stress and said second predetermined stress is compressive and the other of said first predetermined stress and said second predetermined stress is tensile.

15. The method of claim 13, wherein said planarization of said first dielectric layer and said second dielectric layer is adapted to remove a portion of said second stressed layer located above said first dielectric layer.

16. The method of claim 13, wherein said first transistor element comprises a first channel region and said second transistor element comprises a second channel region, one of said first channel region and said second channel region being stressed, the other of said first channel region and said second channel region being substantially unstressed.

17. A method of forming a semiconductor structure, comprising:
providing a substrate comprising a first transistor element and a second transistor element;
forming a first stressed layer above said first transistor element and said second transistor element, said first stressed layer having a first predetermined intrinsic stress;
forming a first dielectric layer above said first transistor element, wherein said first dielectric layer does not cover said second transistor element;
forming a second stressed layer above said first dielectric layer and said second transistor element, said second stressed layer having a second predetermined intrinsic stress that is different than said first predetermined intrinsic stress, wherein said formation of said second stressed layer comprises performing a non-conformal deposition process adapted to deposit a stressed layer of a material above said first dielectric layer and said second transistor element and wherein said formation of said second stressed layer further comprises performing an isotropic etching process to substantially remove a portion of said layer of material located on an edge of said first dielectric layer;
forming a second dielectric layer above said substrate;
planarizing said first dielectric layer and said second dielectric layer; and
forming at least one contact via in said first dielectric layer and forming at least one contact via in said second dielectric layer.

18. The method of claim 17, wherein one of said first predetermined stress and said second predetermined stress is compressive and the other of said first predetermined stress and said second predetermined stress is tensile.

* * * * *